US010177153B2

(12) United States Patent
Kang

(10) Patent No.: US 10,177,153 B2
(45) Date of Patent: Jan. 8, 2019

(54) DRAM CELL FOR REDUCING LAYOUT AREA AND FABRICATING METHOD THEREOF

(71) Applicant: DOSILICON CO., LTD., Shanghai (CN)

(72) Inventor: Tae Gyoung Kang, Yongin-si (KR)

(73) Assignee: DOSILICON CO., LTD., Shanghai (CN)

( * ) Notice: Subject to any disclaimer, the term of this patent is extended or adjusted under 35 U.S.C. 154(b) by 0 days.

(21) Appl. No.: 15/658,598

(22) Filed: Jul. 25, 2017

(65) Prior Publication Data
US 2018/0033791 A1    Feb. 1, 2018

(30) Foreign Application Priority Data

Aug. 1, 2016  (KR) .......................... 10-2016-0098034

(51) Int. Cl.
*H01L 21/82* (2006.01)
*H01L 27/108* (2006.01)

(52) U.S. Cl.
CPC .. *H01L 27/10826* (2013.01); *H01L 27/10805* (2013.01); *H01L 27/10814* (2013.01); *H01L 27/10855* (2013.01); *H01L 27/10873* (2013.01); *H01L 27/10879* (2013.01); *H01L 27/10888* (2013.01)

(58) Field of Classification Search
CPC .................. H01L 27/10826; H01L 21/823487
See application file for complete search history.

(56) References Cited

U.S. PATENT DOCUMENTS

| 8,536,642 | B2 | 9/2013 | Ogawa | |
|---|---|---|---|---|
| 2009/0085088 | A1* | 4/2009 | Takaishi | H01L 21/82348 257/314 |
| 2011/0121374 | A1* | 5/2011 | Ogawa | H01L 27/10876 257/296 |
| 2013/0023095 | A1* | 1/2013 | Nojima | H01L 27/10876 438/268 |

FOREIGN PATENT DOCUMENTS

| JP | 2-135777 | 5/1990 |
|---|---|---|
| JP | 6-13627 | 1/1994 |
| KR | 10-2014-0086647 | 7/2014 |

* cited by examiner

*Primary Examiner* — Moazzam Hossain
*Assistant Examiner* — Omar Mojaddedi
(74) *Attorney, Agent, or Firm* — Kile Park Reed & Houtteman PLLC

(57) ABSTRACT

The fabricating method of a DRAM cell includes forming a facing bar that extends in a direction of the word line; forming a gate of the cell transistor on one side surface of the facing bar; forming a bit line plug that is electrically connected to one side of the transmission channel, which is formed on the one side surface of the facing bar; and forming the storage that is electrically connected to the other side of the transmission channel, which is formed on the horizontal surface of the semiconductor substrate. A pair of DRAM cells shares a facing bar and a bit line plug. In accordance with the present disclosure, a required layout area is significantly reduced.

4 Claims, 9 Drawing Sheets

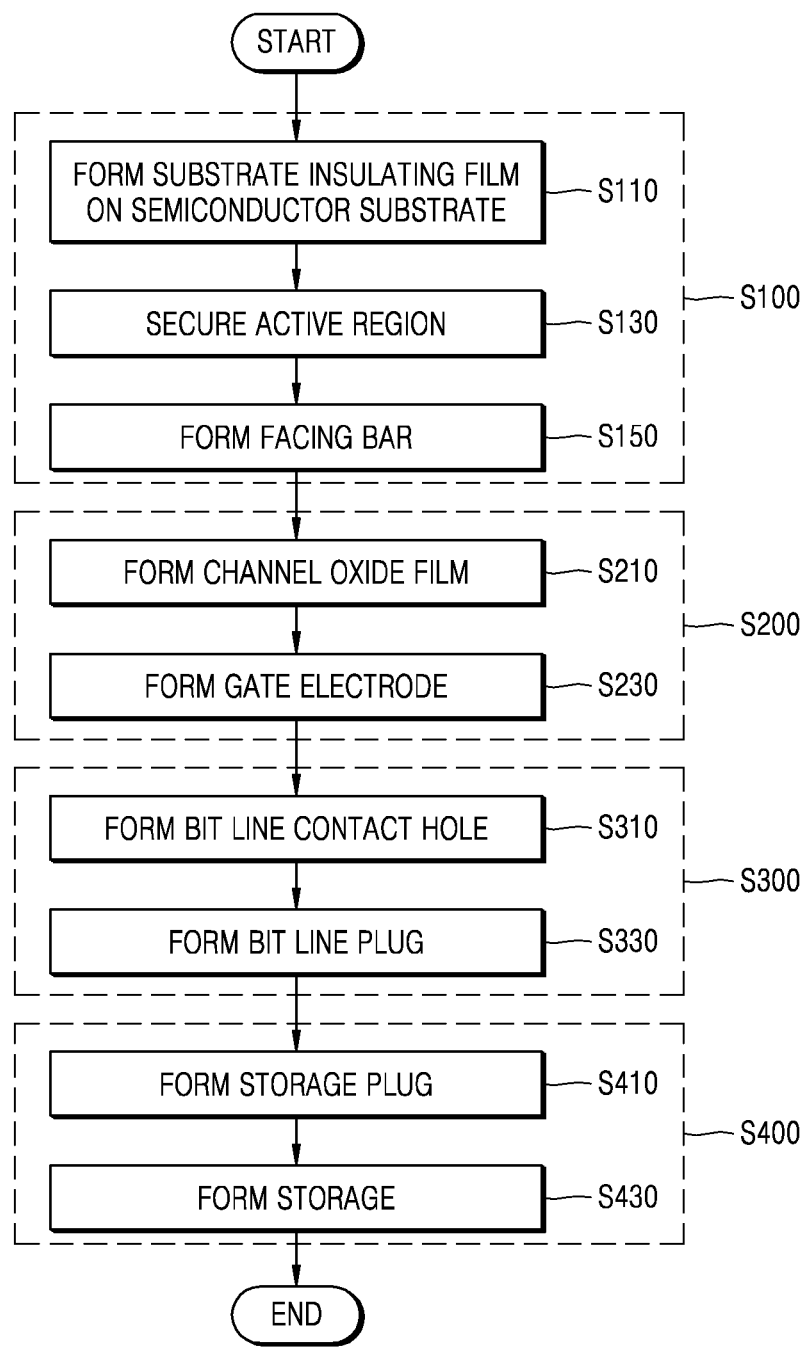

DRAM CELL FOR REDUCING LAYOUT AREA AND FABRICATING METHOD THEREOF

CROSS-REFERENCE TO RELATED APPLICATION

This application claims priority to and the benefit of Korean Patent Application No. 10-2016-0098034, filed on Aug. 1, 2016, the disclosure of which is incorporated herein by reference in its entirety.

BACKGROUND

1. Field of the Invention

The present disclosure relates to a semiconductor memory device, and more particularly, to a dynamic random access memory (DRAM) cell for reducing a layout area and a fabricating method thereof.

2. Discussion of Related Art

Generally, a dynamic random access memory (DRAM) is formed to include a plurality of DRAM cells. At this point, each of the plurality of DRAM cells is configured with a single cell transistor and a single storage. The storage is able to store charges, and the cell transistor forms a transmission channel for conducting between a bit line and the storage according to a voltage applied to a gate electrode.

Meanwhile, as a DRAM is becoming highly integrated, research is underway on a DRAM cell for reducing a layout area. Specifically, research is actively underway on technologies for reducing a layout area while securing a certain length of a transmission channel of a cell transistor. One of such technologies for reducing a layout area of a cell transistor realizes a cell transistor provided with a vertical-type pillar. Such a cell transistor provided with a vertical-type pillar is able to realize a transmission channel having a desired channel length even in a limited layout area.

However, since such a cell transistor provided with a vertical-type pillar calls for a single pillar per DRAM cell, there is a limitation in reducing a layout area of a DRAM cell.

SUMMARY OF THE INVENTION

Therefore, an objective of the present disclosure is to provide a dynamic random access memory (DRAM) cell for reducing a layout area, and a fabricating method thereof.

In accordance with one aspect of the present disclosure, there is provided a fabricating method of a DRAM cell that is formed to correspond to a intersecting point between a word line and a bit line and includes a storage and a cell transistor, wherein the storage is configured to store charges and the cell transistor is configured to forma transmission channel for electrically connecting the bit line to the storage according to a voltage applied to a gate electrode that is formed as a part of the word line. The fabricating method of a DRAM cell includes forming a facing bar that has a constant width and a constant height with respect to a horizontal surface of a semiconductor substrate and extends in a direction of the word line; forming a gate of the cell transistor on one side surface of the facing bar, wherein the transmission channel of the cell transistor is formed to be in contact with the one side surface of the facing bar and the horizontal surface of the semiconductor substrate; forming a bit line plug that is electrically connected to one side of the transmission channel, which is formed on the one side surface of the facing bar, wherein the bit line plug is electrically connected to the bit line; and forming the storage that is electrically connected to the other side of the transmission channel, which is formed on the horizontal surface of the semi conductor substrate.

In accordance with other aspect of the present disclosure, there is provided a dynamic random access memory (DRAM) cell. The dynamic random access memory (DRAM) cell comprises a cell transistor configured to form a transmission channel according to a voltage applied to a gate electrode that is formed as a part of a word line, wherein one side of the transmission channel is electrically connected to a bit line through a bit line plug; and a storage configured to store charges and electrically connected to the other side of the transmission channel of the cell transistor. And, the one side of the transmission channel of the cell transistor is formed at one side of a facing bar that has a constant width and a constant height with respect to a horizontal surface of a semiconductor substrate and extends in a horizontal direction of the word line, and the other side of the transmission channel of the cell transistor is formed on the horizontal surface of the semiconductor substrate.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which:

FIG. 4 is a flowchart illustrating a fabricating method of DRAM cells according to the present disclosure.

DETAILED DESCRIPTION OF EXEMPLARY EMBODIMENTS

Reference should be made to the accompanying drawings that illustrate preferred embodiments of the present disclosure and to the content described in the accompanying drawings to fully understand the present disclosure, operational advantages of the present disclosure, and objectives that are attainable by implementing the present disclosure.

Figure 1:
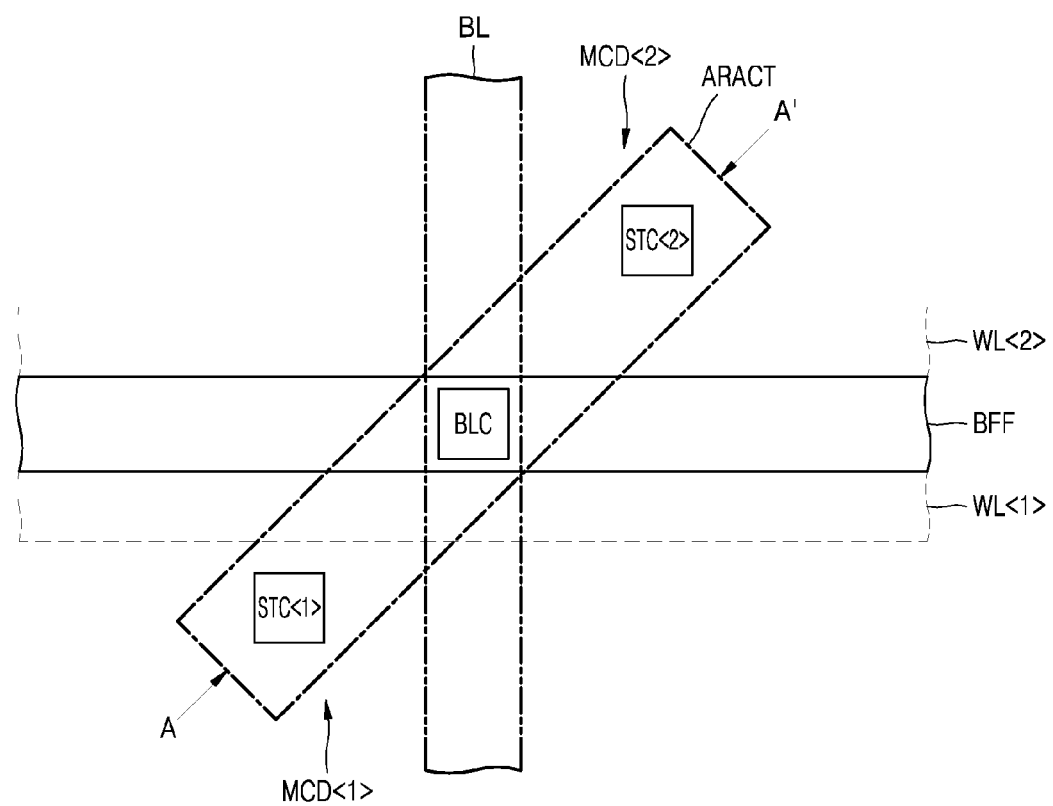
FIG. 1 is a diagram for describing a layout of dynamic random access memory (DRAM) cells according to one embodiment of the present disclosure.
Figure 2:
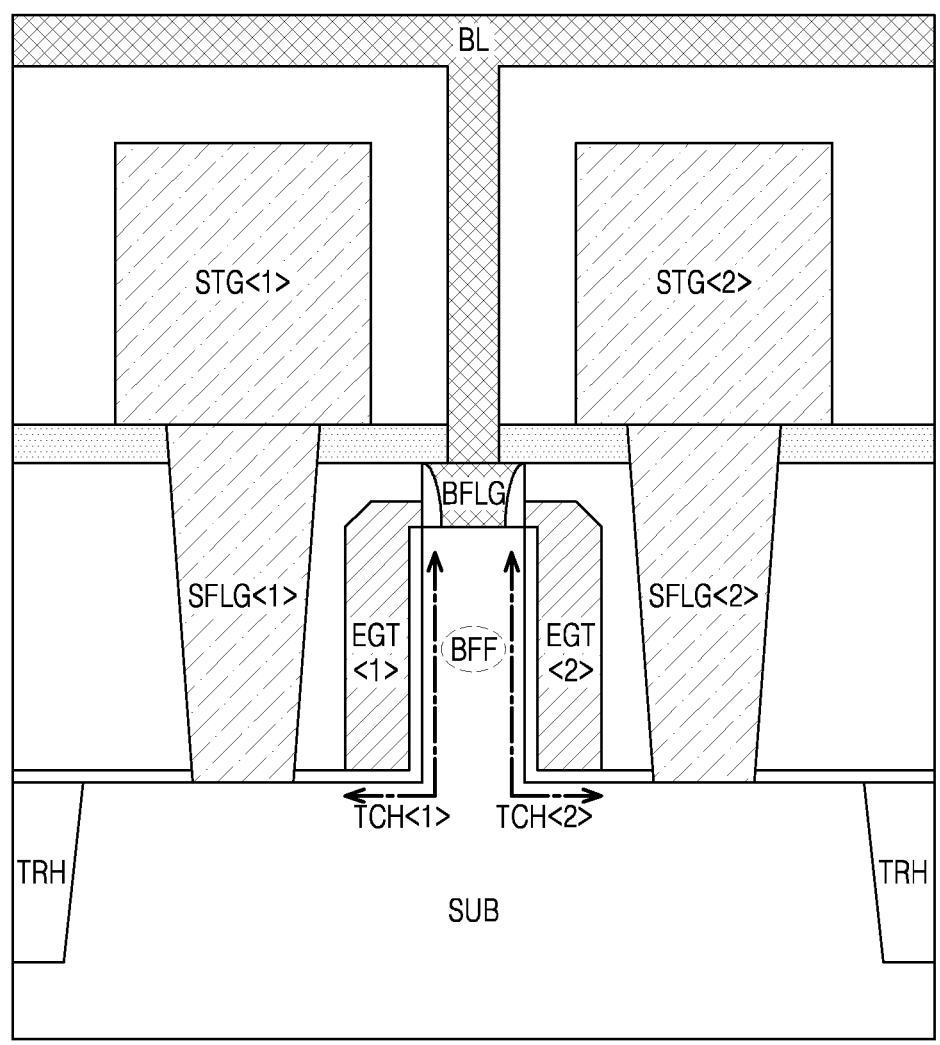
FIG. 2 is a cross-sectional view taken along line A-A' of FIG. 1.

FIG. 1 is a diagram for describing a layout of dynamic random access memory (DRAM) cells according to one embodiment of the present disclosure, and a pair of DRAM cells MCD<1> and MCD<2> are illustrated. FIG. 2 is a cross-sectional view taken along line A-A' of FIG. 1.

Referring to FIGS. 1 and 2, the pair of DRAM cells MCD<1> and MCD<2> are symmetrically formed based on a facing bar BFF. The facing bar BFF has a constant width and a constant height and extends to be parallel to a horizontal surface of a semiconductor substrate in a first direction (that is, a lateral direction in FIG. 1). Further, a word line WL<1> and a word line WL<2> are formed at both side surfaces of the facing bar BFF.

In the DRAM cells according to the present disclosure, the word lines WL<1> and WL<2> are formed without using a photo mask. At this point, portions of the word lines WL<1> and WL<2>, included in an active region ARACT respectively form gate electrodes EGT<1> and EGT<2> of cell transistors STR<1> and STR<2>.

A bit line BL extends in a second direction (that is, a vertical direction in FIG. 1). Further, a bit line contact hole BLC is formed to correspond to an intersecting point between the facing bar BFF and the bit line BL. At this point, one junctions of the cell transistors STR<1> and STR<2> of the DRAM cells MCD<1> and MCD<2> are commonly electrically connected to the bit line BL through a bit line plug BFLG that is formed to be buried in the bit line contact hole BLC.

Further, the other one junction of each of the cell transistors STR<1> and STR<2> of the DRAM cells MCD<1> and MCD<2> is electrically connected to a storage STG<1> or STG<2> through a storage plug SFLG<1> or SFLG<2> which is formed to be buried in a storage contact hole STC<1> or STC<2>.

To describe again, the facing bar BFF extends long in a direction of the word lines WL<1> and WL<2>. The word lines WL<1> and WL<2>, that is, the gate electrodes EGT<1> and EGT<2> of the cell transistors STR<1> and STR<2> are formed at both of side surfaces of the facing bar BFF. Consequently, the gate electrodes EGT<1> and EGT<2> of the cell transistors STR<1> and STR<2> are formed to be in contact with both of the side surfaces of the facing bar BFF and the horizontal surface of the semiconductor substrate.

Further, the one junctions of the cell transistors STR<1> and STR<2> of the DRAM cells MCD<1> and MCD<2> are commonly connected to the bit line plug BFLG that is connected to the bit line BL. Also, the pair of DRAM cells MCD<1> and MCD<2> are formed to correspond to intersecting points between the word line WL<1> or WL<2> and the bit line. Further, the storages STG<1> and STG<2> of the cell transistors STR<1> and STR<2> of the pair of DRAM cells MCD<1> and MCD<2> are symmetrically formed based on the bit line plug BFLG.

Figure 3:
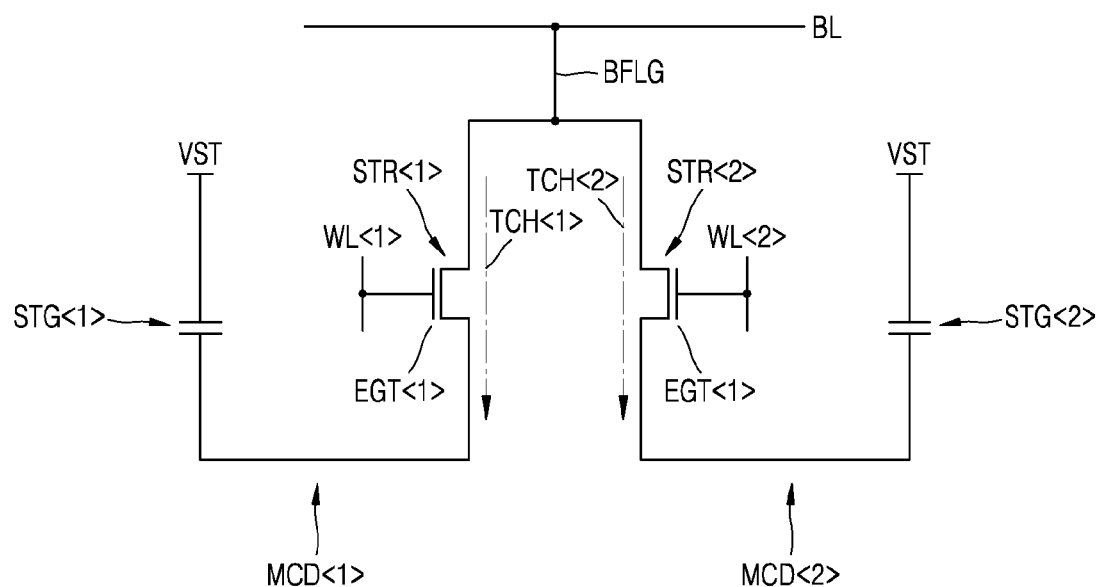
FIG. 3 is a diagram illustrating an equivalent circuit of the DRAM cells shown in FIGS. 1 and 2.

FIG. 3 is a diagram illustrating an equivalent circuit of the DRAM cells shown in FIGS. 1 and 2. Referring to FIGS. 1 to 3, each of the DRAM cells MCD<1> and MCD<2> is configured with a single cell transistor STR<1> or STR<2> and a single storage STG<1> or STG<2>.

At this point, the one junction of the cell transistor STR<1> or STR<2> is electrically connected to the bit line BL through the common bit line plug BFLG, and the other one junction thereof is connected to one side of the storage STG<1> or STG<2>. For reference, a storage voltage VST is applied to the other sides of the storages STG<1> and STG<2>.

Further, the cell transistor STR<1> or STR<2> forms a transmission channel TCH<1> or TCH<2> for conducting between the bit line BL and the storage STG<1> or STG<2> according to a voltage applied to the gate electrode EGT<1> or EGT<2>, that is, a voltage of the word line WL<1> or WL<2>.

At this point, the transmission channel TCH<1> or TCH<2> is formed to include a vertical direction component and a horizontal direction component. Further, the vertical direction component of the transmission channel TCH<1> or TCH<2> is formed at one side of the facing bar BFF. That is, the vertical direction components of the transmission channels TCH<1> and TCH<2> of the DRAM cells MCD<1> and MCD<2> are formed to face each other at both sides of the facing bar BFF.

In the above-described DRAM cells according to the present disclosure, the pair of DRAM cells MCD<1> and MCD<2> share the facing bar BFF and the bit line plug BFLG That is, the cell transistors STR<1> and STR<2> of the pair of two DRAM cells MCD<1> and MCD<2> respectively form the transmission channels TCH<1> and TCH<2> facing each other at both sides of the facing bar BFF which is common to the cell transistors STR<1> and STR<2>. Also, the pair of DRAM cells MCD<1> and MCD<2> are connected to the bit line BL through the common bit line plug BFLG.

To described again, one sides of the transmission channels TCH<1> and TCH<2> of the pair of two DRAM cells MCD<1> and MCD<2> are formed at the both sides of the facing bar BFF, and are commonly connected to the bit line BL through the bit line plug BFLG. At this point, the other sides of the transmission channels TCH<1> and TCH<2> of the pair of two DRAM cells MCD<1> and MCD<2> are formed on the horizontal surface of the semiconductor substrate.

Consequently, in accordance with the above-described DRAM cells of the present disclosure, a required layout area is significantly reduced.

In addition, a method of fabricating a DRAM cell according to the present disclosure will be described below. FIG. 4 is a flowchart illustrating a method of fabricating a DRAM cell according to the present disclosure. Further, FIGS. 5A to 5I are diagrams each illustrating a cross section in each operation according to the method of fabricating a DRAM cell. For reference, in FIGS. 5A to 5I, a reference numeral not including "< >" is shown and described with respect to each component to simplify description.

Referring to FIG. 4, a method of fabricating a DRAM cell MCD according to the present disclosure includes forming a facing bar (S100), forming a gate (S200), forming a bit line plug (S300), and forming a storage (S400).

The forming of the facing bar (S100) specifically includes forming an insulating film (S110), forming an active region (S130), and forming the facing bar (S150).

Figure 5A:
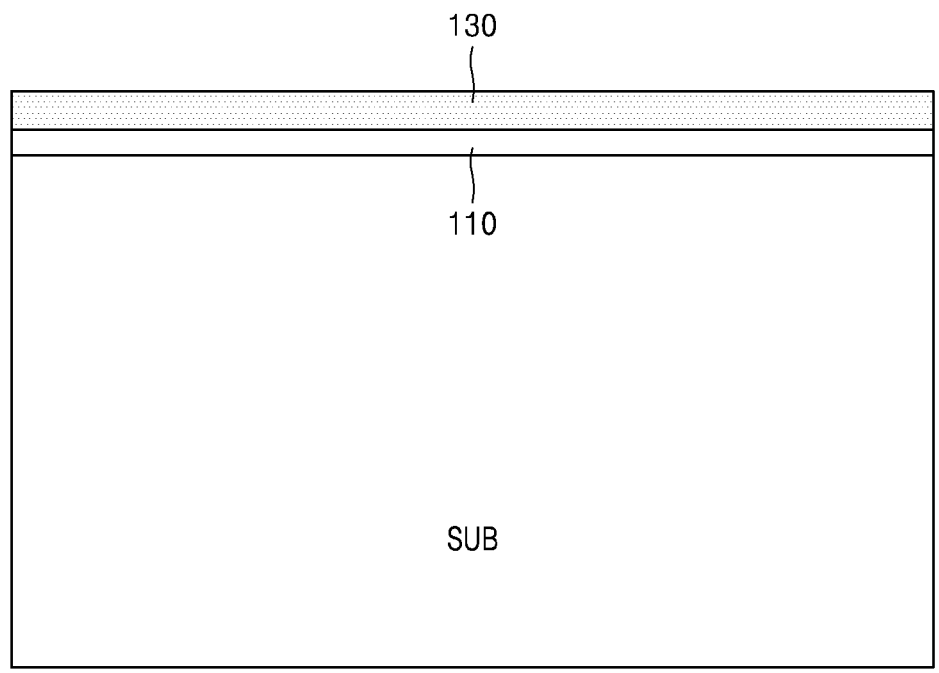
FIGS. 5A to 5I are diagrams each illustrating a cross section in each operation according to the fabricating method of a DRAM cell.

In the forming of the insulating film (S110), as shown in FIG. 5A, a substrate insulating film 130 is deposited and formed on a semiconductor substrate SUB on which a substrate oxide film 110 is formed. At this point, the substrate insulating film 130 may be formed of a nitride film (SiN) or the like.

Figure 5B:
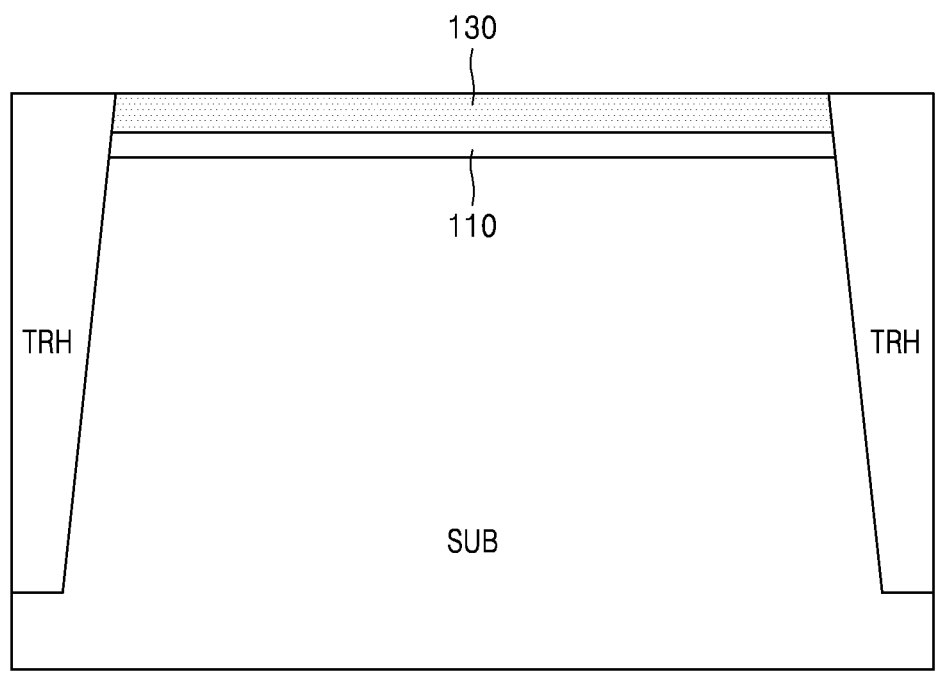

In the forming of the active region (S130), as shown in FIG. 5B, a separation trench TRH is formed in the semiconductor substrate SUB on which the substrate insulating film 130 is formed. At this point, a process of forming the separation trench TRH may be performed using a photo mask or the like to mask an active region ARACT, this process is well known to those skilled in the art, and thus a detailed description thereof will be omitted. Subsequently, an insulating material, e.g., an oxide layer, is buried in the separation trench TRH to secure the active region ARACT of the DRAM cell MCD.

Figure 5C:
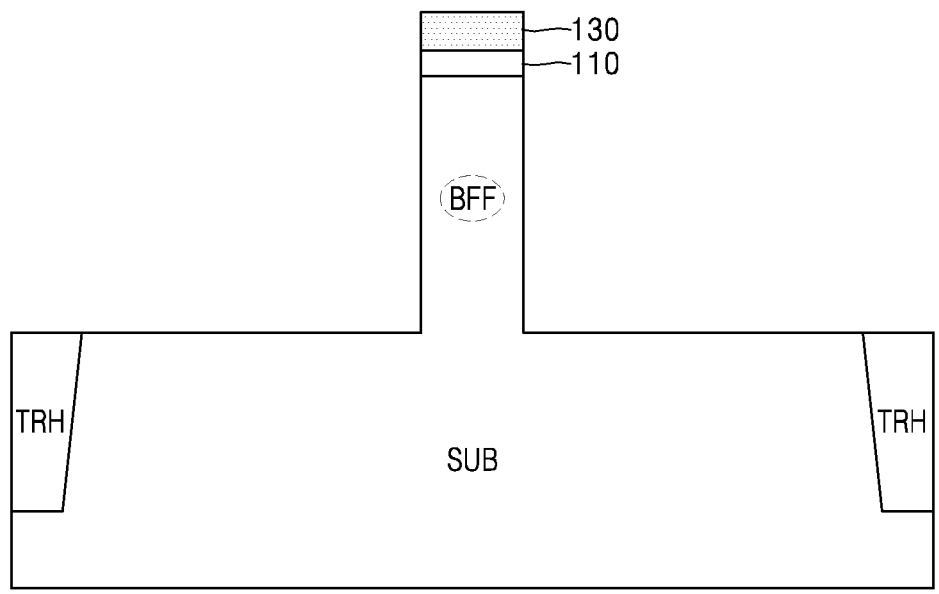

In the forming of the facing bar (S150), as shown in FIG. 5C, the semiconductor substrate SUB in which the separation trench TRH filled with the insulating material is formed is etched to form a facing bar BFF. At this point, a photo mask for masking a region in which the facing bar BFF is formed may be used. Through the forming of the facing bar (S150), the facing bar BFF is formed to have a constant width and a constant height with respect to the horizontal surface of the semiconductor substrate SUB and to extend in a direction of a word line.

The forming of the gate (S200) specifically includes forming a channel oxide film (S210) and forming the gate electrode (S230).

Figure 5D:
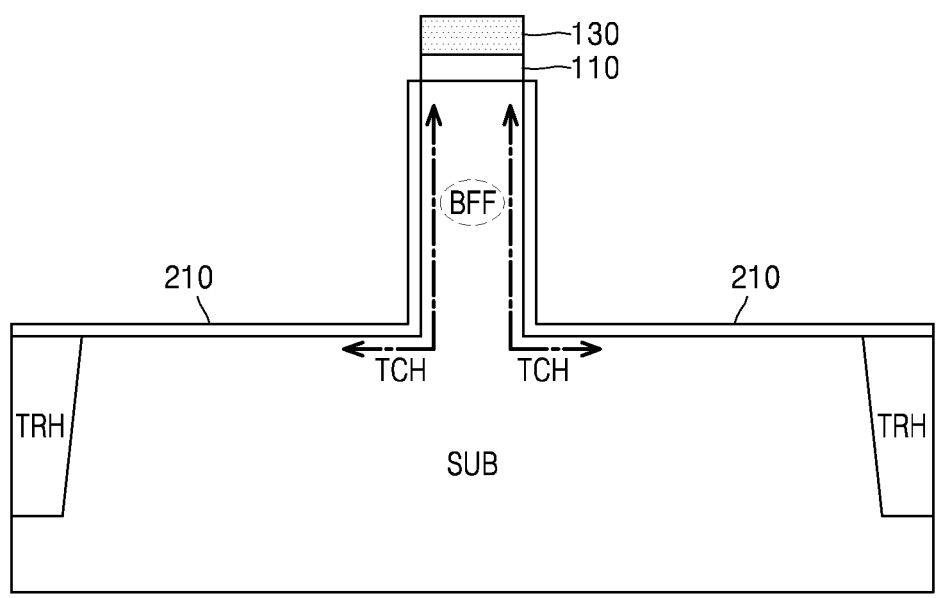

In the forming of the channel oxide film (S210), as shown in FIG. 5D, channel impurities are implanted into one side surface of the facing bar BFF and the horizontal surface of the semiconductor substrate SUB to form a transmission channel TCH of a cell transistor STR. At this point, when the semiconductor substrate SUB is a p-type substrate, the channel impurities are n-type impurities. Further, a channel oxide film 210 is formed on the one side surface of the facing bar BFF and the horizontal surface of the semiconductor substrate SUB, wherein both the one side surface and the horizontal surface are implanted with the channel impurities.

Figure 5E:
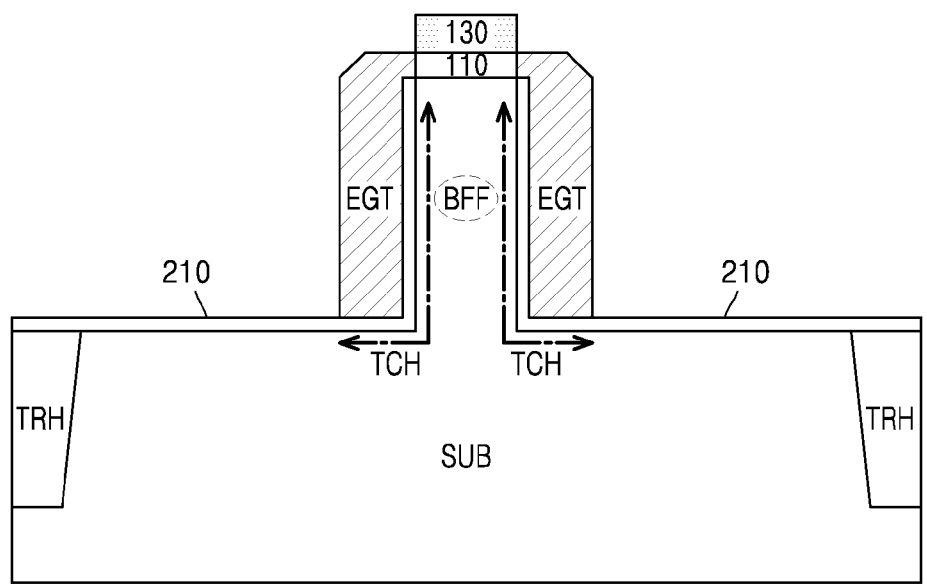

In the forming of the gate electrode (S230), as shown in FIG. 5E, a gate electrode EGT is formed to be in contact with the one side surface of the facing bar BFF and the horizontal surface of the semiconductor substrate SUB, wherein the channel oxide film 210 is formed on the one side surface and the horizontal surface.

To describe in detail, a conductive material such as poly-silicon is deposited on the one side surface of the facing bar BFF and the horizontal surface of the semiconductor substrate SUB, wherein the channel oxide film 210 is formed on the one side surface and the horizontal surface. Further, the deposited poly-silicon is formed and becomes the gate electrode EGT through a spacer etching technique. Such a spacer etching technique is well known in the related art. Therefore, a detailed description thereof will be omitted in the present application.

In the forming of the gate (S200) as described above, the gate electrode EGT of the cell transistor STR is formed on the one side surface of the facing bar BFF. Further, the transmission channel TCH of the cell transistor STR is formed to be in contact with the one side surface of the facing bar BFF and the horizontal surface of the semiconductor substrate SUB according to a voltage of a gate signal VGT applied to the gate electrode EGT. At this point, a gate electrode EGT (shown at the right side of the drawing) of another DRAM cell paired with the DRAM cell MCD is formed on the other side surface of the facing bar BFF. Consequently, a transmission channel of a cell transistor of the other DRAM cell paired with the DRAM cell MCD is formed at the other side surface of the facing bar BFF.

Meanwhile, the gate electrode EGT may be entirely or partially silicidated. Since a surface resistance of the silicidated gate electrode EGT is significantly reduced, the silicidated gate electrode EGT may have high conductivity. Further, a technique for such silicidation of the gate electrode EGT is well known to those skilled in the art, and thus a detailed description thereof will be omitted in the present application.

Also, the gate electrode EGT may be entirely or partially formed of a metal such as tungsten (W) or titanium (Ti). In this case, the gate electrode EGT may have high conductivity. Further, a process of entirely or partially forming the gate electrode EGT with a metal is well known to those skilled in the art, and thus a detailed description thereof will be omitted in the present application.

The forming of the bit line plug (S300) specifically includes forming a bit line contact hole (S310) and forming the bit line plug (S330).

Figure 5F:
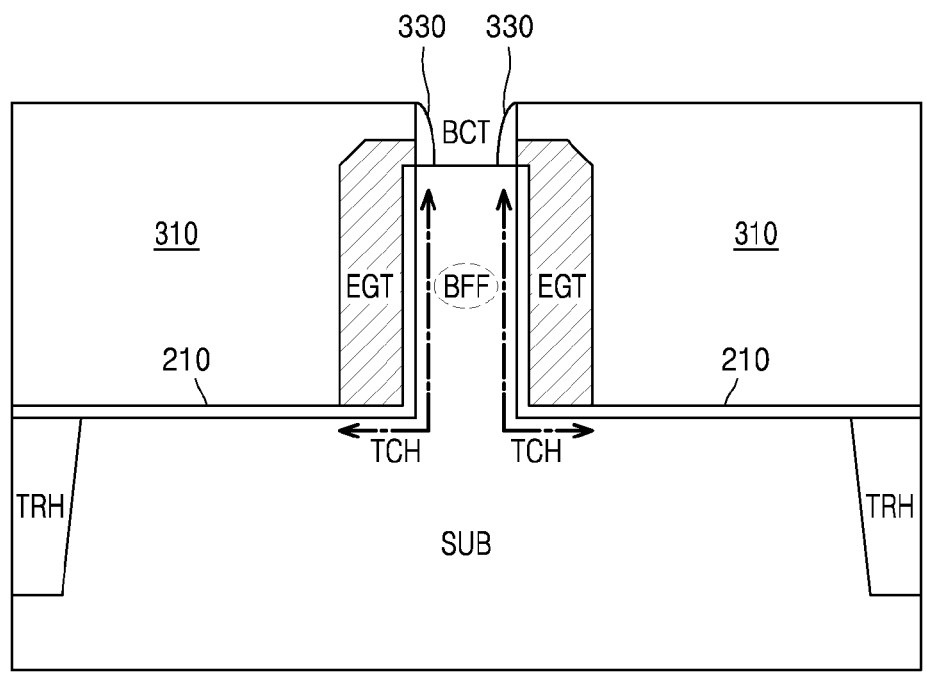

In the forming of the bit line contact hole (S310), a bit line contact hole BCT is formed as shown in FIG. 5F. At this point, the bit line contact hole BCT is preferably formed to expose a portion of the gate electrode EGT. That is, in a state in which the gate electrode EGT is formed, an intermediate oxide film 310 is formed and a planarization process is performed. Further, the substrate insulating film 130 and the substrate oxide film 110, which are disposed on the facing bar BFF, are removed.

Subsequently, junction impurities are implanted to form one junction of the transmission channel TCH. At this point, when the semiconductor substrate SUB is a p-type substrate, the junction impurities are n-type impurities. Further, a contact sidewall oxide film 330 is formed on a sidewall inside the bit line contact hole BCT. Consequently, an exposed portion of the gate electrode EGT may be protected. Such a contact sidewall oxide film 330 may be formed by a spacer etching technique, and this can be easily understood by those skilled in the art.

In the forming of the bit line contact hole (S310) as described above, the bit line contact hole BCT is formed above the facing bar BFF.

Figure 5G:
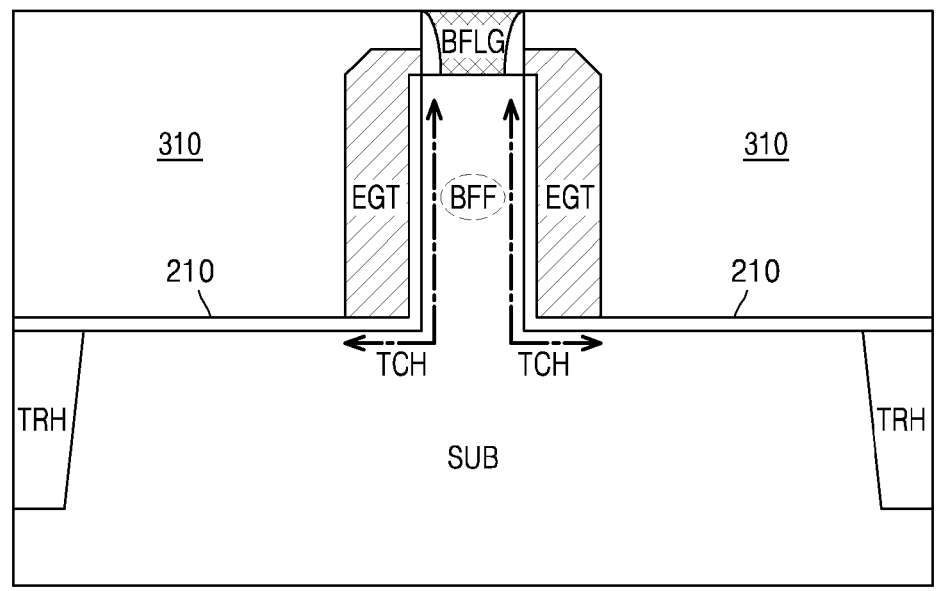

In the forming of the bit line plug (S330), as shown in FIG. 5G, the bit line contact hole BCT is filled with a conductive material (for example, a metal such as tungsten, or poly-silicon), and then a planarization process is performed. Consequently, in the forming of the bit line plug (S330), the bit line plug BFLG is formed.

In the forming of the bit line plug (S300) as described above, the bit line plug BFLG is formed to be electrically connected to one side of the transmission channel TCH, which is formed on one side surface of the facing bar BFF. As described above, the bit line plug BFLG is electrically connected to the bit line BL through a subsequent process.

The forming of the storage (S400) specifically includes forming a storage plug (S410) and forming the storage (S430).

Figure 5H:
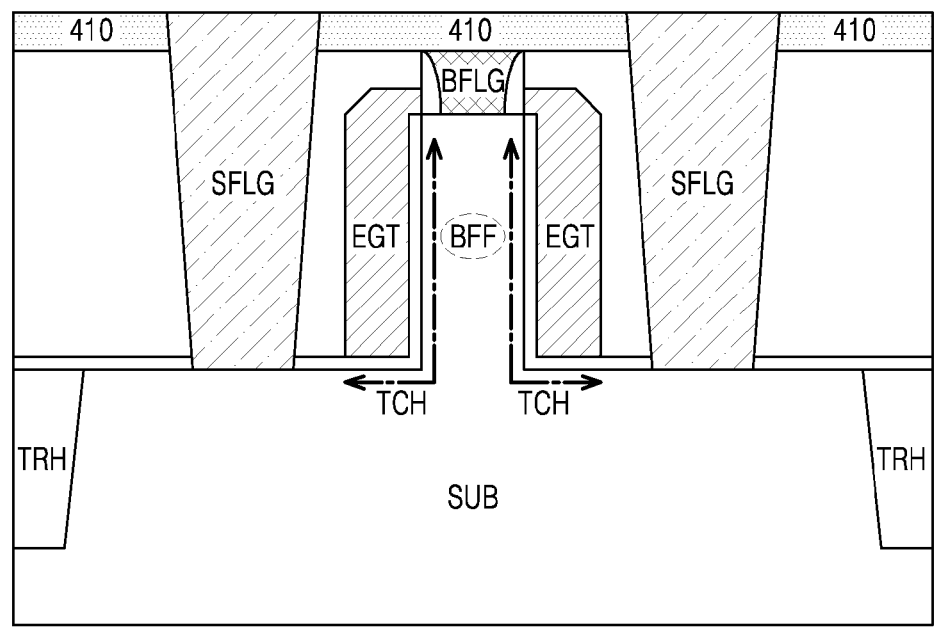

In the forming of the storage plug (S410), as shown in FIG. 5H, the storage plug SFLG is formed to be electrically connected to the other side of the transmission channel TCH, which is formed on the horizontal surface of the semiconductor substrate.

To describe the forming of the storage plug (S410) in detail, in a state in which the bit line plug BFLG is formed, first, an intermediate insulating film 410 is formed. At this point, the intermediate insulating film 410 may be realized with a nitride film (SiN). Thereafter, the intermediate oxide film 310 of a storage contact hole STC region is etched to expose the horizontal surface of the semiconductor substrate SUB. A process of etching the intermediate oxide film 310 may be performed by wet etching or dry etching and use a photo mask.

Subsequently, junction impurities are implanted into the storage contact hole STC at which the semiconductor substrate SUB is exposed to form the other junction of the transmission channel TCH. At this point, when the semiconductor substrate SUB is a p-type substrate, the junction impurities are n-type impurities. Subsequently, the storage contact hole STC is filled with a conductive material (for example, a metal such as tungsten, or poly-silicon), and then a planarization process is performed. Consequently, in the forming of the storage plug (S410), the storage plug SFLG is formed.

Figure 5I:
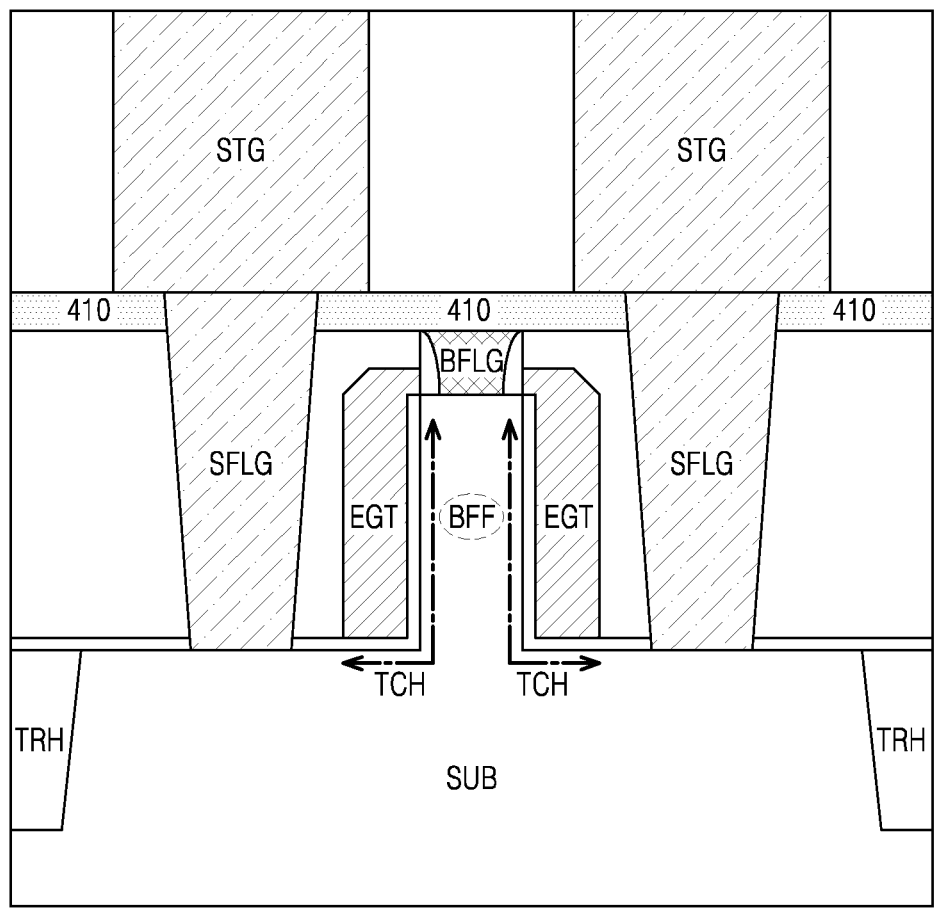

Further, in the forming of the storage (S430), as shown in FIG. 5I, the storage STG is formed to be electrically connected to the storage plug SFLG and to be able to store charges. The forming of the storage (S430) is well known to those skilled in the art, and thus a detailed description thereof will be omitted.

In the forming of the storage (S400), the storage STG is formed to be able to store charges. At this point, the storage STG is electrically connected to the other side of the transmission channel TCH.

Subsequently, a process of forming the bit line BL is performed, and thus, as shown in FIG. 2, the pair of DRAM cells sharing the facing bar BFF and the bit line plug BFLG are realized.

The pair of the DRAM cells, which each have the above-described configuration and are provided according to the method of fabricating a DRAM cell of the present disclosure, share the facing bar and the bit line plug. Therefore, in accordance with the DRAM cells produced according to the method of fabricating a DRAM cell of the present disclosure, a required layout area is significantly reduced.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A fabricating method of a dynamic random access memory (DRAM) cell formed to correspond to an intersecting point between a word line and a bit line and including a storage and a cell transistor, wherein the storage is configured to store charges and the cell transistor is configured to form a transmission channel for electrically connecting the bit line to the storage according to a voltage applied to a gate electrode that is formed as a part of the word line, where the transmission channel includes a first side and a second side, the fabricating method comprising:

forming a facing bar that has a constant width and a constant height with respect to a horizontal surface of a semiconductor substrate and extends in a direction of the word line, where the facing bar includes a first side surface and a second side surface;

forming a gate of the cell transistor on the first side surface of the facing bar, wherein the transmission channel of the cell transistor is formed to be in contact with the first side surface of the facing bar and the horizontal surface of the semiconductor substrate;

forming a bit line plug that is electrically connected to the first side of the transmission channel, which is formed on the first side surface of the facing bar, wherein the bit line plug is electrically connected to the bit line; and forming the storage that is electrically connected to the second side of the transmission channel, which is formed on the horizontal surface of the semiconductor substrate, wherein a gate electrode of another DRAM cell paired with the DRAM cell is formed at the second side surface of the facing bar, and the bit line plug is electrically connected to one side of a transmission channel of the another DRAM cell paired with the DRAM cell, and wherein the forming of the facing bar includes:

forming a substrate insulating film on the semiconductor substrate;

forming a separation region to form an active separation region on the semiconductor substrate, on which the substrate insulating film is formed, so as to secure an active region of the DRAM cell;

etching the semiconductor substrate at which the active separation region is formed; and forming the facing bar.

2. The fabricating method of claim 1, wherein the forming of the gate of the cell transistor includes: implanting channel impurities into the first side surface of the facing bar and the horizontal surface of the semiconductor substrate to form the transmission channel of the cell transistor, and then forming a channel oxide film; and forming a gate electrode of the cell transistor to be in contact with the first side surface of the facing bar and the horizontal surface of the semiconductor substrate, wherein the channel oxide film is formed on the first side surface of the facing bar and the horizontal surface.

3. The fabricating method of claim 1, wherein the forming of the bit line plug includes:

forming a bit line contact hole above the facing bar; and filling the bit line contact hole with a first conductive material and forming the bit line plug, wherein the bit line plug is electrically connected to the one side of the transmission channel of the cell transistor.

4. The fabricating method of claim 1, wherein the forming of the storage includes:

forming a storage contact hole by exposing the horizontal surface of the semiconductor substrate, and then forming a storage plug by filling the storage contact hole with a second conductive material, wherein the storage plug is electrically connected to the other side of the transmission channel; and forming the storage that is electrically connected to the storage plug.

* * * * *